United States Patent
Yamate et al.

(10) Patent No.: US 6,657,697 B2
(45) Date of Patent: Dec. 2, 2003

(54) LIQUID CRYSTAL DISPLAY DEVICE HAVING AN IMPROVED ATTACHMENT STRUCTURE OF A CHIP COMPONENT

(75) Inventors: Hiroshi Yamate, Mobara (JP); Yoshiyuki Tsujita, Mobara (JP)

(73) Assignee: Hitachi, Ltd., Tokyo (JP)

( * ) Notice: Subject to any disclaimer, the term of this patent is extended or adjusted under 35 U.S.C. 154(b) by 190 days.

(21) Appl. No.: 09/739,337

(22) Filed: Dec. 19, 2000

(65) Prior Publication Data

US 2001/0005241 A1 Jun. 28, 2001

(30) Foreign Application Priority Data

Dec. 22, 1999 (JP) .......................................... 11-363607

(51) Int. Cl.$^7$ ............................................ G02F 1/1333
(52) U.S. Cl. ........................................ 349/151; 345/89
(58) Field of Search ................................ 349/150, 151; 345/89

(56) References Cited

U.S. PATENT DOCUMENTS 5,942,185 A * 8/1999 Nakatsuka et al. ......... 420/562
6,266,120 B1 * 7/2001 Han ........................... 349/150
6,411,359 B1 * 6/2002 Kobayashi et al. .......... 349/149

FOREIGN PATENT DOCUMENTS

| JP | 11-326937 | 5/1998 |
| KR | 1999-42507 | 11/1997 |

OTHER PUBLICATIONS

Office Action dated Oct. 1, 2002 from Korean Patent Office in Korean and its translation in English.

* cited by examiner

Primary Examiner—Robert H. Kim
Assistant Examiner—P. R. Akkapeddi (57) ABSTRACT

A liquid crystal display device having a circuit board mounting with a chip component which has a pair of electrodes disposed at its respective ends thereon, and a pair of land areas on the circuit board to which the pair of electrodes are soldered respectively. Each of the pair of land areas is covered with a protrusion of a solder resist layer protruding from a middle point of an edge thereof opposite to another edge thereof facing another of the pair of land areas toward a center thereof. The distance L between the protrusions of the solder resist layer satisfies an inequality: $L \geq EL$ where EL is a distance between the outer ends of the pair of electrodes of the chip component.

12 Claims, 8 Drawing Sheets

LIQUID CRYSTAL DISPLAY DEVICE HAVING AN IMPROVED ATTACHMENT STRUCTURE OF A CHIP COMPONENT

BACKGROUND OF THE INVENTION

The present invention relates to a liquid crystal display device used for a personal computer, a work station and others, and in particular to a liquid crystal display device employing an attachment structure of a chip component capable of improving productivity and productive capacity of circuit boards of the liquid crystal display device.

Liquid crystal display modules of the STN (Super Twisted Nematic) type or the TFT (Thin Film Transistor) type are widely used as a display device of a notebook personal computer and the like.

Such liquid crystal display modules are comprised of a liquid crystal display panel having a driver circuit section disposed at its periphery and a backlight unit for illuminating the liquid crystal display panel.

The backlight unit includes in a molded case, a light guide for directing light emitted from a light source to uniformly illuminate the entire display area of the liquid crystal display panel, a cold-cathode fluorescent lamp serving a line light source disposed in the vicinity of the side of the light guide in parallel with the side of the light guide, a light diffusing sheet disposed on the light guide, a lens sheet (also called a prism sheet) disposed on the light diffusing sheet, and a reflector sheet extending below the light guide, for example.

Such techniques are described in Japanese Patent Publication No. Sho 60-19474 and Japanese Utility Model Application Laid-open No. Hei 4-22780, for example.

Generally, a liquid crystal display module is equipped with a driver circuit board (TCON board) having mounted thereon a display control device for controlling and driving the driver circuit section of the liquid crystal display panel, and chip components such as resistor elements are soldered on the driver circuit board.

A lead (Pb)-containing solder paste (Sn-37Pb) has been used for soldering the chip components. But there is a demand that lead-free solder pastes should be used instead of lead-containing solder pastes so as to improve mechanical characteristics (adhesion). However, there has been a problem in that, if a lead-free solder (e.g., an Sn-3.5 Ag-0.7Cu solder) is used instead of a conventional solder (Sn-37 Pb), defective soldering of chip components (a chip standing phenomenon) occurs frequently due to a higher melting point of the lead-free solder. While the melting point of the Sn-37Pb system solder is 183° C., the melting points of lead-free solders are usually equal to or more than 200° C. Greater detail of lead-free solders is contained in U.S. Pat. No. 5,942,185 issued on Aug. 24, 1999 and U.S. Pat. No. 5,918,795 issued on Jul. 6, 1999. These two patents are incorporated by reference herein for the purpose of disclosure.

Whether the above-mentioned lead-free solder is used or not, the above-described defective soldering occur according to manners of heating the boards during the soldering step. Frequency of occurrences of defective soldering is distinctly increased only by accelerating slightly the speed of increasing the temperature of heating the board or by increasing slightly the temperature of heating the board, for example, and therefore, especially if the lead-free solder is used in the assembling step of the driver circuit board, measures against defective soldering is more necessary.

Techniques for preventing defective soldering by modifying the shape of the land areas formed on the printed circuit boards are disclosed by Japanese Patent Application Laid-open No. Hei 2-23694 (laid-open on Jan. 25, 1990) and a complete specification of Japanese Utility Model Application Laid-open Hei 2-36074 laid-open on Mar. 8, 1990 which is recorded in a microfilm of the Japanese Patent Office, for example. However, neither of the techniques disclosed in the two references could not solve the problem of defective soldering completely.

SUMMARY OF THE INVENTION

The present invention is made to solve the problem with the prior art, and it is an object of the present invention to provide a liquid crystal display device capable of reducing defective soldering of chip components to its circuit board.

The above-mentioned and other objects and novel features of the present invention will become apparent by reference to the following description and the accompanying drawing.

The following is a representative one of liquid crystal display devices of the present invention disclosed in this application.

In accordance with an embodiment of the present invention, there is provided a liquid crystal display device comprising a liquid crystal display panel including a pair of opposing substrates and a liquid crystal layer sandwiched between the pair of opposing substrates, at least one driver circuit disposed at a periphery of one of the pair of opposing substrates for applying a drive voltage to the liquid crystal layer, a circuit board mounting thereon a display control circuit for controlling and driving the at least one driver circuit, the circuit board including a chip component having a pair of electrodes disposed at respective ends thereof, the pair of electrodes being soldered to a pair of land areas disposed on the circuit board, respectively, a portion of a respective one of the pair of land areas being covered with a protrusion of a solder resist layer protruding from a center of a side of the respective one of the pair of land areas opposite from mutually facing sides of the pair of land areas toward a center of the respective one of the pair of land areas, and a distance L between the protrusions of the solder resist layer satisfying the inequality L≧EL, where EL is a distance between outer ends of the pair of electrodes of the chip component.

In accordance with another embodiment of the present invention, there is provided a liquid crystal display device comprising a liquid crystal display panel including a pair of opposing substrates and a liquid crystal layer sandwiched between the pair of opposing substrates, at least one driver circuit disposed at a periphery of one of the pair of opposing substrates for applying a drive voltage to the liquid crystal layer, a circuit board mounting thereon a display control circuit for controlling and driving the at least one driver circuit, the circuit board including a chip component having a pair of electrodes disposed at respective ends thereof, the pair of electrodes being soldered to a pair of land areas disposed on the circuit board, respectively, a portion of a respective one of the pair of land areas being covered with a protrusion of a solder resist layer protruding from a center of a side of the respective one of the pair of land areas opposite from mutually facing sides of the pair of land areas toward a center of the respective one of the pair of land areas, a distance L between the protrusions of the solder resist layer satisfying an inequality L≧EL, where EL is a distance between outer ends of the pair of electrodes of the chip component, and a length h of the protrusion of the solder resist layer as measured in a protruding direction thereof satisfying an inequality $h \geq EL/10$.

The present invention can reduce the excess amount of a solder adhering to sides of electrodes at both ends of a chip component contributory to the chip-standing phenomenon and consequently, can reduce defective soldering of the chip component (a chip-standing defect).

BRIEF DESCRIPTION OF THE DRAWINGS

In the accompanying drawings, in which like reference numerals designate similar components throughout the figures, and in which:

FIGS. 5A and 5B are illustrations for explaining the reason why detrimental standing of a chip component is reduced in the present embodiment.

DETAILED DESCRIPTION OF THE PREFERRED EMBODIMENTS

The embodiments of the present invention will be explained in detail by reference to the drawings. Like reference numerals or characters designate functionally similar parts or portions throughout the drawings for explaining the embodiments, and repetition of their explanations is omitted.

Embodiment 1

Figure 1:
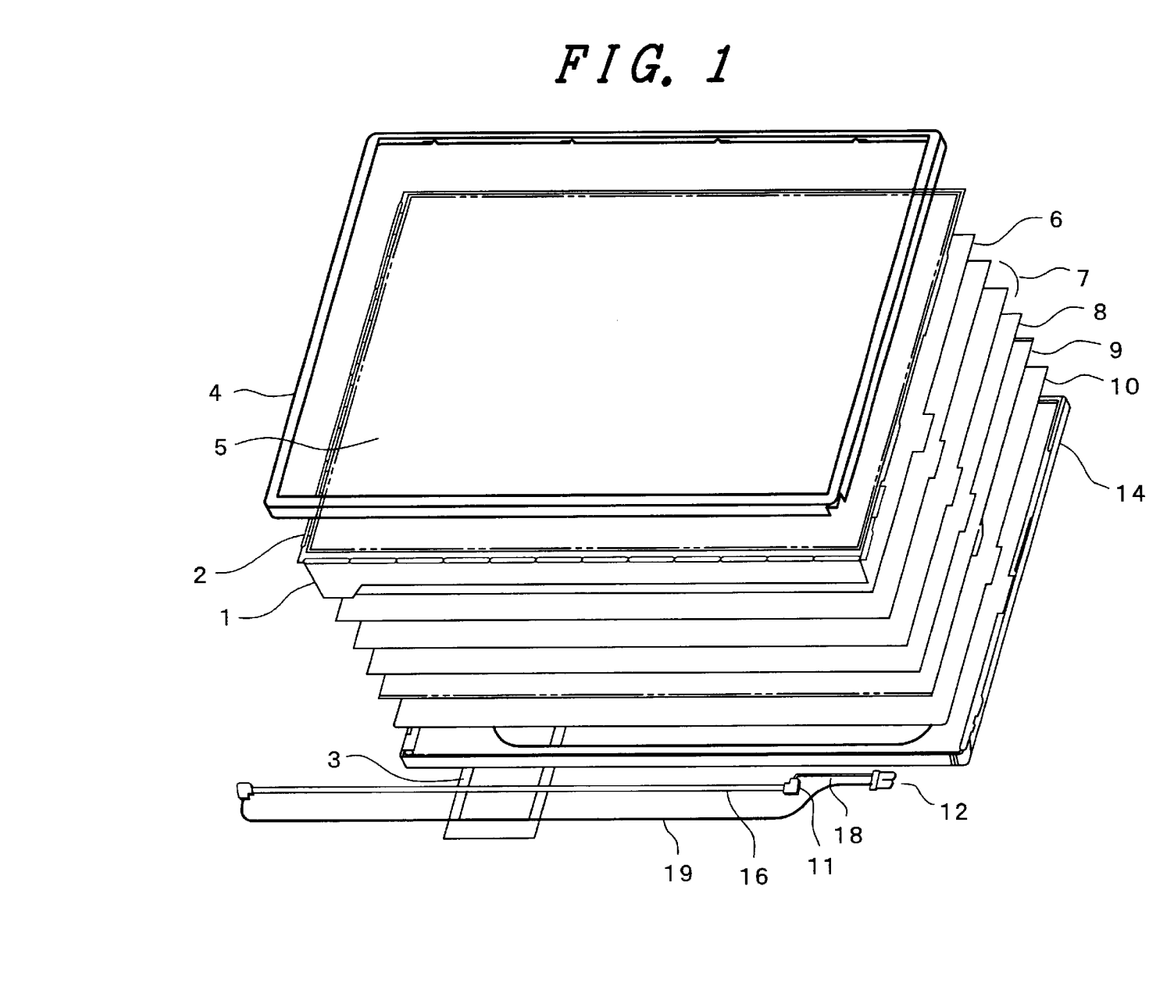
FIG. 1 is a schematic exploded perspective view of a first embodiment of a liquid crystal display module (LCM) of the TFT type in accordance with the present invention.

Basic configuration of a liquid crystal display module of the TFT type of the present embodiment FIG. 1 is a schematic exploded perspective view of a liquid crystal display module (LCM) of the TFT type of this embodiment.

The liquid crystal display module (LCM) of the TFT type of this embodiment is comprised of a peripheral rectangular metal frame 4, a liquid crystal panel (LCD) 5, and a-backlight unit. The liquid crystal display panel 5 comprises a TFT substrate having pixel electrodes and thin film transistors thereon, a filter substrate having a counter electrode and color filters thereon, a sealing member in the form of a peripheral rectangular frame for sealing together the TFT substrate and the filter substrate superposed upon one another with a desired spacing therebetween, a liquid crystal material filled into a space between the two substrates via a filling hole formed in the sealing member which will be closed subsequently, and a pair of polarizers attached on the respective outer surfaces of the two substrates.

Mounted on a glass substrate of the TFT substrate are a plurality of drain drivers fabricated as integrated circuits (ICs) and a plurality of gate drivers fabricated as integrated circuits (ICs). The drain drivers are supplied with drive power supply voltages, display data and control signals via a flexible printed wiring board 1, and the gate drivers are supplied with drive power supply voltages and control signals via a flexible printed wiring board 2. The two flexible printed wiring boards 1, 2 are connected to a driver circuit board (a TCON board) 3 disposed behind the backlight unit.

The backlight unit of the liquid crystal display module of this embodiment is comprised of a cold-cathode fluorescent lamp 16, a light guide in the form of a wedge a side view of which is trapezoidal, diffusing sheets 6, 8, a lens sheet 7, a reflector sheet 10 arranged in the order as indicated in FIG. 1 and fitted in a molded case 14 in the form of a rectangular peripheral frame having a side wall. In FIG. 1, reference numeral 11 denotes a rubber bushing, 12 is a connector, and 18 and 19 are cables.

In the liquid crystal display module of this embodiment, the liquid crystal display panel 5 having mounted thereon the plural drain drivers and the plural gate drivers is housed between the frame 4 having a display window and the backlight unit as shown in FIG. 1. As shown in FIG. 1, the driver circuit board (the TCON board) 3 is disposed behind the backlight unit.

Figure 2A:
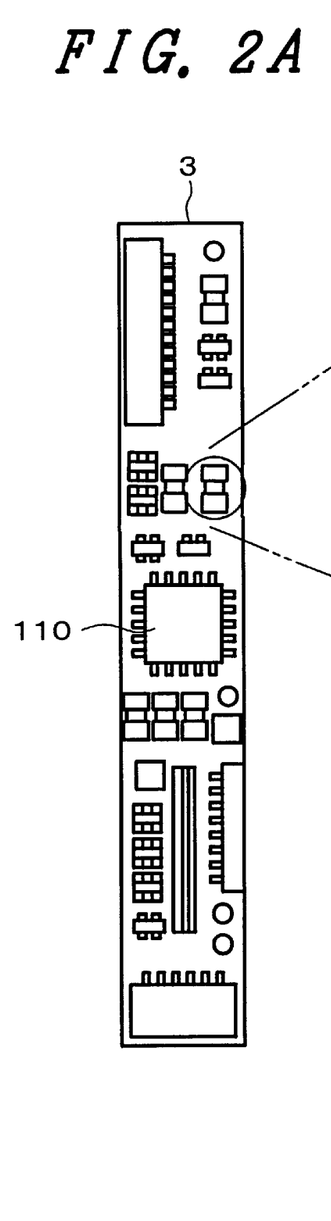
FIG. 2A is a plan view of an example of a driver circuit board shown in FIG. 1.
Figure 2B:
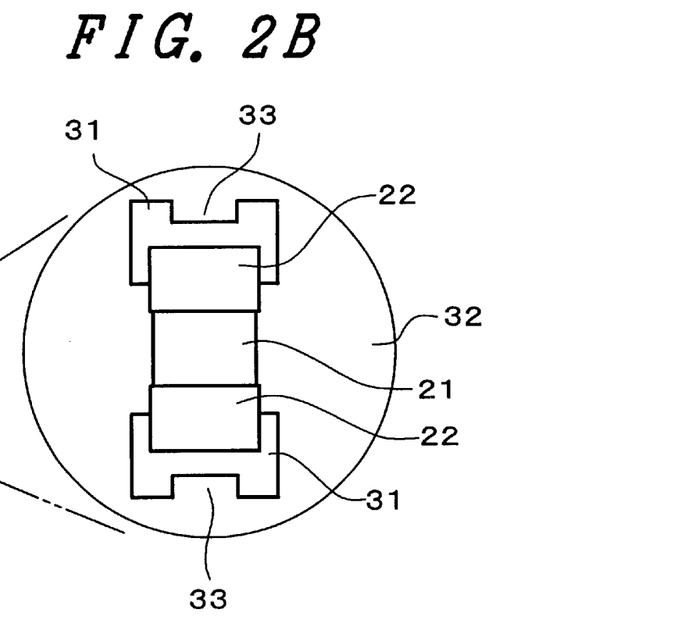
FIG. 2B is an enlarged view of an indicated portion of the driver circuit board of FIG. 2A.

FIG. 2A is a plan view of an example of the driver circuit board 3 shown in FIG. 1, and FIG. 2B is an enlarged view of an indicated portion of the driver circuit board of FIG. 2A.

As shown in FIGS. 2A and 2B, mounted on the driver circuit board 3 is a display control device (the TCON) 110 for controlling and driving the drain drivers and the gate drivers, and a chip component 21 such as a resistor element is soldered to the driver circuit board 3. This chip component 21 has electrodes 22 at both ends, these two electrodes 22 are soldered to a pair of land areas 31 disposed on the driver circuit board 3 to solder the chip component 21 on the driver circuit board 3.

In this embodiment, as shown in FIG. 2B, a portion of each of the pair of land areas 31 is covered with a solder resist protrusion 33 made integrally with a solder resist layer (a resin layer).

Figure 3A:
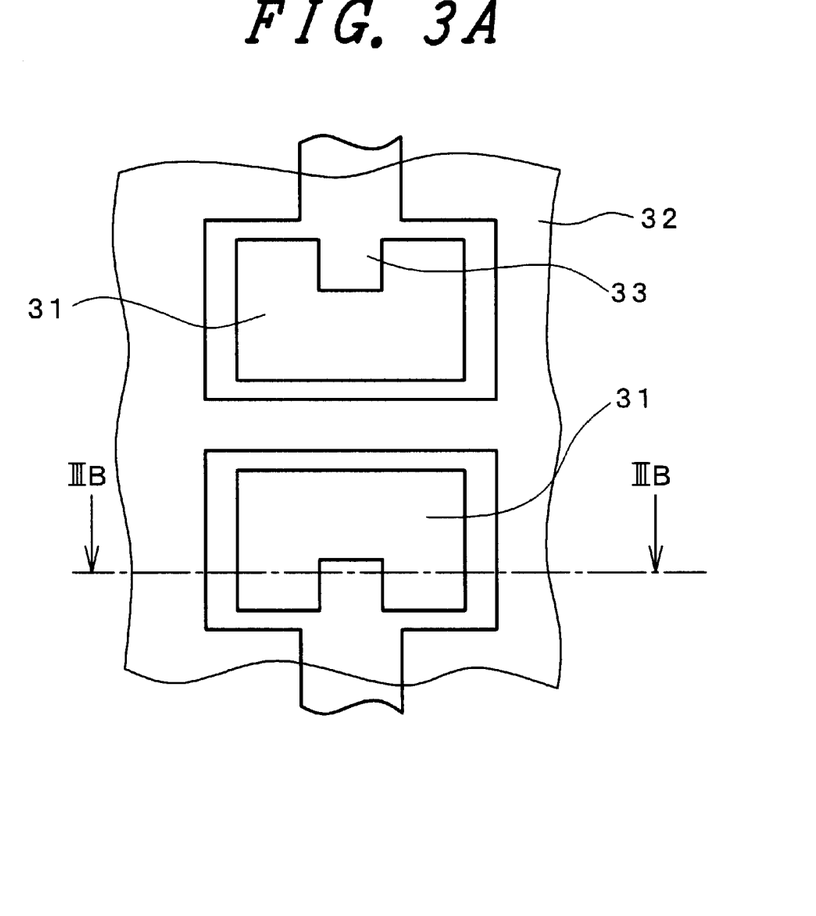
FIG. 3A is a fragmentary plan view for illustrating a relationship between a pair of land areas and a solder resist layer shown in FIG. 2B.
Figure 3B:
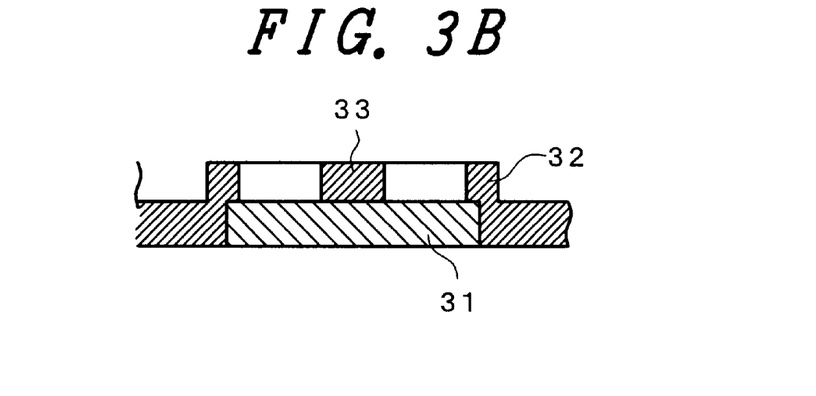
FIG. 3B is a cross-sectional view of the pair of land areas and the solder resist layer of FIG. 3A taken along line IIIB—IIIB of FIG. 3A.

FIGS. 3A and 3B are illustrations for showing a relationship between the pair of land areas 31 and the solder resist layer 32 shown in FIG. 2B, FIG. 3A is a fragmentary plan view of the pair of land areas 31 and the solder resist layer 32 shown in FIG. 2B, and FIG. 3B is a cross-sectional view of essential portions of the pair of land areas 31 and the solder resist layer 32 of FIG. 3A taken along line IIIB—IIIB of FIG. 3A.

As shown in FIGS. 3A and 3B, the solder resist layer 32 is formed on the top surface of the driver circuit board 3, and the pair of land areas 31 are disposed below the solder resist layer 32. As is well known, the solder resist layer 32 has a function of repelling molten solders. The pair of land areas 31 are made of copper (Cu) layers, are made in the same process step as for forming wiring patterns of the driver circuit board 3, and are electrically connected to the desired wiring patterns.

Each of the pair of land areas 31 is surrounded with the solder resist layer 32, and portions of the pair of land areas 31 not covered by the solder resist 32 are soldered to electrodes 22 of the chip component 21.

In this embodiment, a portion of a respective one of the pair of land areas 31 is covered with a protrusion 33 of the solder resist 32 protruding from a center of a side of the respective one of the pair opposite from the facing sides of the pair of land areas 31 toward the center of the respective one of the pair.

Figure 4:
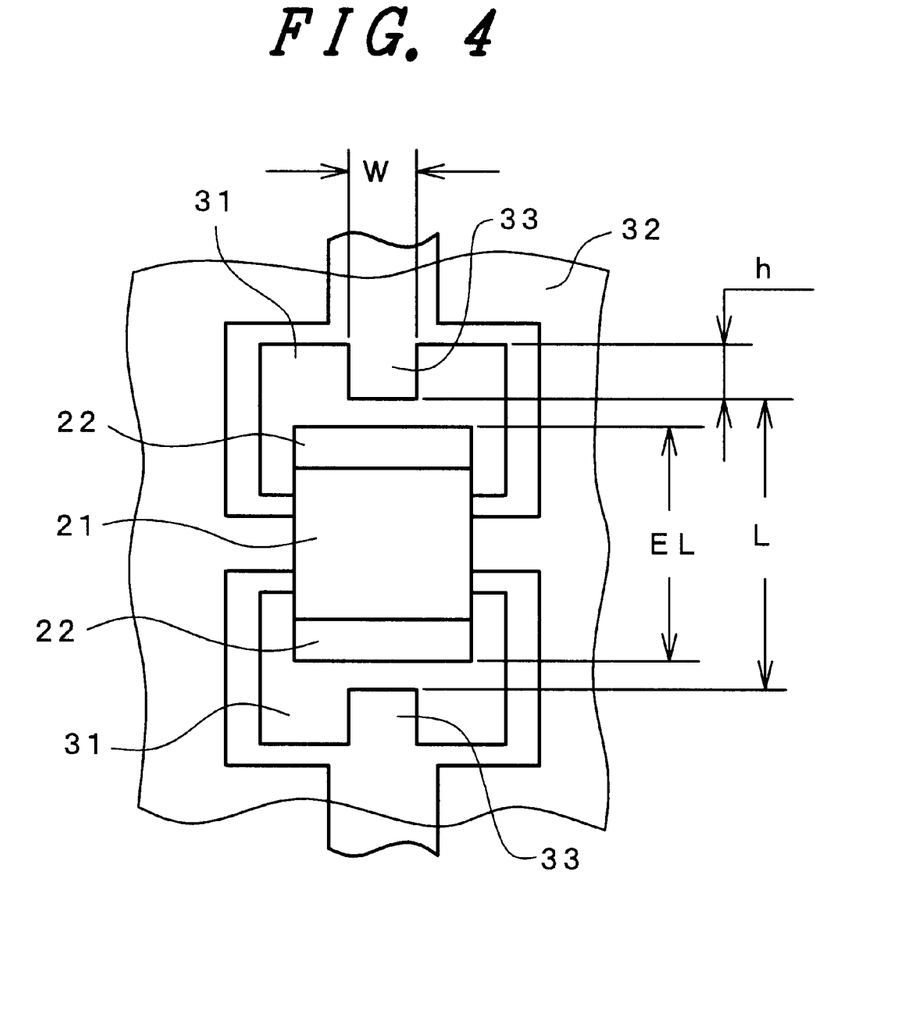
FIG. 4 is a fragmentary plan view of a solder resist layer of an embodiment in accordance with the present invention for explaining dimensions of protrusions of the solder resist layer.

FIG. 4 is a plan view of the solder resist layer 32 of this embodiment for explaining dimensions of the protrusions 33 of the solder resist layer.

As shown in FIG. 4, in this embodiment, a distance L between the protrusions 33 of the solder resist layer 32 is chosen to satisfy the following inequality:

$$L \geq EL,$$

where EL is a length of the chip component 21 (i.e., a distance between outer ends of the two electrodes 22 of the chip component 21).

Also the length h and the width w of the protrusions 33 of the solder resist layer 32 are chosen to satisfy the following inequalities:

$$h \geq EL/10, \text{ and}$$

$$w \geq EL/10.$$

Figure 8A:
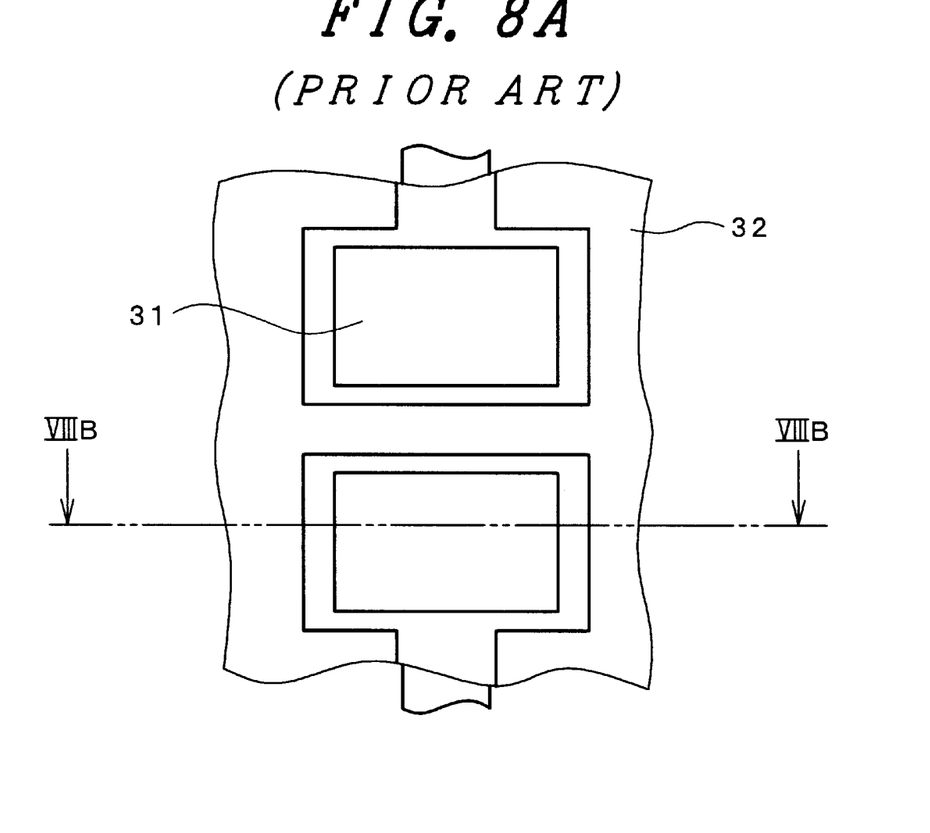
FIG. 8A is a fragmentary plan view for illustrating a relationship between a pair of land areas and a solder resist layer in a driver circuit board of a prior art liquid crystal display module.
Figure 8B:
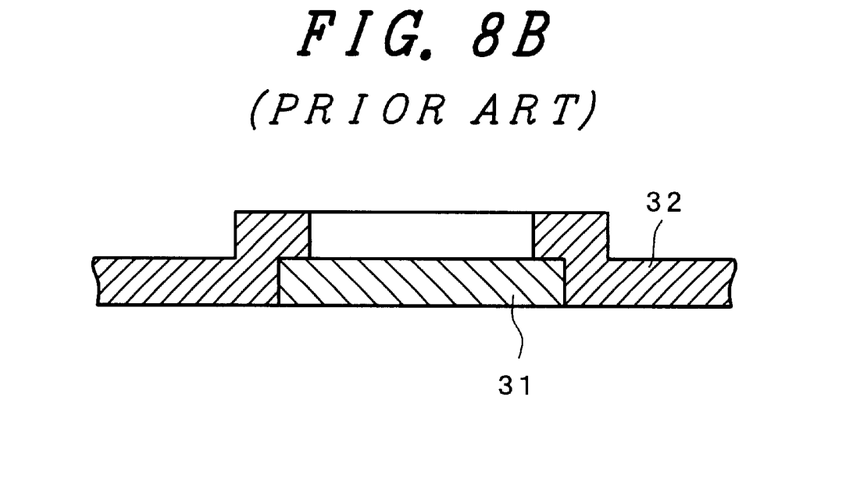
FIG. 8B is a cross-sectional view of the pair of land areas and the solder resist layer of FIG. 8A taken along line VIIIB—VIIIB of FIG. 8A.

FIGS. 8A and 8B are illustrations for explaining a relationship between a pair of land areas 31 and a solder resist layer 32 in the driver circuit board 3 of a prior art liquid crystal display module, FIG. 8A is a plan view of the pair of land areas 31 and the solder resist layer 32, and FIG. 8B is a cross-sectional view of an essential part of the pair of land areas 31 and the solder resist layer 32 of FIG. 8A taken along line VIIIB—VIIIB of FIG. 8A.

As shown in FIGS. 8A and 8B, in the driver circuit board 3 of the prior art liquid crystal display module, the solder resist layer 32 is not formed with protrusions 33 unlike this embodiment.

With this configuration of the solder resist layer 32 of the prior art driver circuit board 3, as already described above, there has been a problem in that defective soldering of the chip components 21, i.e., chip-standing defects occur frequently, if a lead-free solder paste (e.g., an Sn-3.5 Ag-0.7 Cu solder) is used instead of a conventional solder paste (Sn-37 Pb).

Figure 9A:
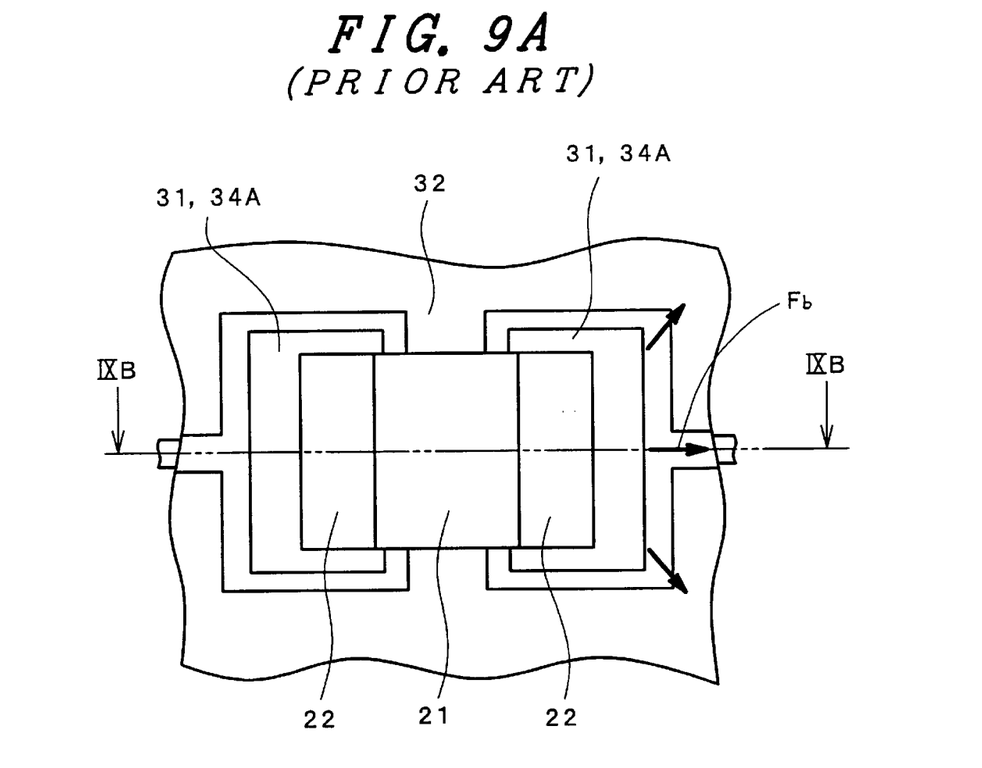
FIG. 9A is a plan view of a chip component standing from a molten solder.
Figure 9B:
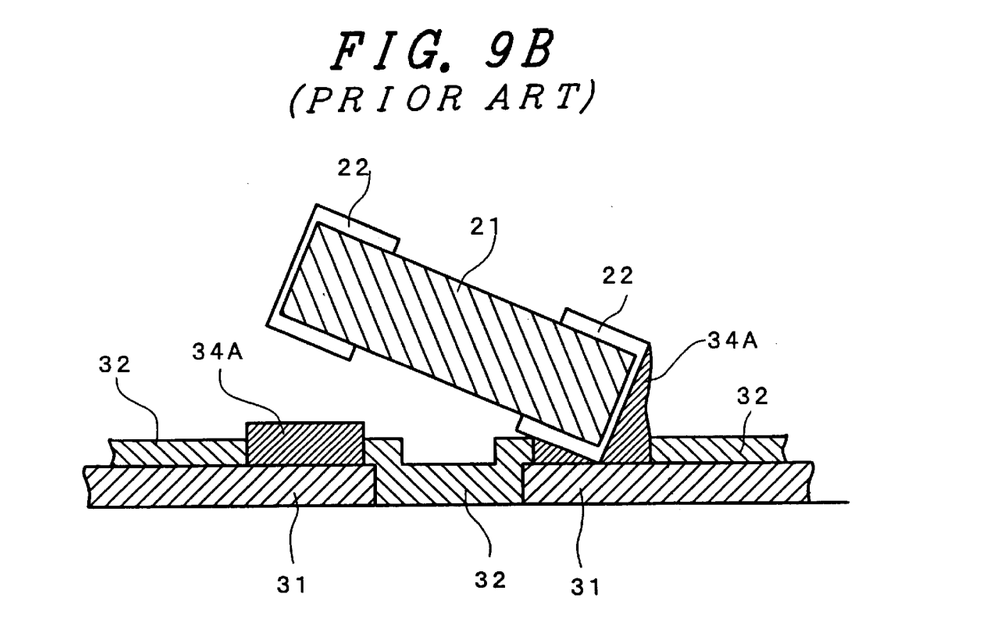
FIG. 9B is a cross-sectional view of the chip component and the molten solder of FIG. 9A taken along line IXB—IXB of FIG. 9A.

FIGS. 9A and 9B are illustrations for explaining detrimental standing of the chip component 21, FIG. 9A is a plan view of the chip component 21 standing from a land area 31, and FIG. 9B is a cross-sectional view of an essential part of the chip component 21 and the molten solder 34A of FIG. 9A taken along line IXB—IXB of FIG. 9A.

The detrimental standing of the chip component 21 is a defect such that one of the electrodes 22 of the chip component 21 is lifted away from a corresponding of the land areas in the soldering operation and consequently, the chip component 21 is fixed to the driver circuit board 3 without electrical connection between the one of the electrodes 22 and the corresponding one of the two land areas 31.

As shown in FIGS. 9A and 9B, in a structure of a driver circuit board in which a wiring pattern including the land areas 31 made of a conductive material (copper in this case) is covered with a resist layer 32 a thickness of which is smaller than that of the wiring pattern, and a portion of each of the land areas 31 is exposed by making an opening in the solder resist layer 32 overlying a corresponding one of the land areas 31, a depression surrounded by the solder resist layer 32 is formed on each of the land areas 31.

The solder paste 34 is supplied to each of the plural depressions formed on the driver circuit board through a mask, and then is molten in a reflow furnace. The molten solders 34A are collected in the depressions, and consequently, the surface tension of the molten solder 34A is relaxed in comparison with surface tension produced by a solder molten on a land area raised above the surrounding surface of the driver circuit board described in the above-mentioned Japanese Utility Model Laid-open No. Hei 2-36074.

Therefore, it was thought that, in the land area 31 having a cross section of the shape depressed with respect to the solder resist layer 32 as shown in FIG. 8B or 9B, the amount of the molten solder 34A creeping up the end faces of the electrodes 22 of the chip component 21 is reduced compared with that in the land area disclosed in Japanese Utility Model Laid-open No. Hei 2-36074.

However, the problem of defective soldering arose again which is caused by the molten solder 34A creeping up the end faces of the electrodes 22 of the chip components 21, especially due to increase in the temperature of heating the driver circuit board during the soldering step.

Such a defect occurs frequently in soldering a pair of electrodes of chip components of the general rectangular parallelepiped having the pair of electrodes provided on opposite ends thereof, to a pair of land areas.

In reflowing of a solder, a solder and a flux on one of a pair of land areas 31 where the solder has started to melt earlier than in the other of the pair of land areas 31 pull a corresponding one of the electrodes 22 of the chip component 21 and consequently, produce such a moment as to rotate the chip component 21. As a result, as shown in FIGS. 9A and 9B, the chip component 21 having a small angular moment is pulled into the molten solder 34A such that one of the electrodes 22 of the chip component 21 is lifted away from a corresponding one of the land areas 31 and therefore the chip component 21 is fixed to the driver circuit board 3 without electrical connection between the one of the electrodes 22 and the corresponding one of the two land areas 31.

Now the cause of detrimental standing of the chip component 21 will be explained.

It is necessary to raise a reflow temperature for lead-free solders by about 20° to 30° C. compared with that for conventional solder pastes because the lead-free solders have higher melting points than the conventional solder pastes.

Further, circuit boards (about 0.3 mm–0.5 mm in thickness) thinner than generally used printed circuit boards (about 1 mm in thickness) are most widely used for the driver circuit board 3, and it is thought that the reason why the time for solders to begin to melt varies from place to place is that the thinner circuit board easily introduces non-uniformity in temperature on the circuit board.

Figure 5A:
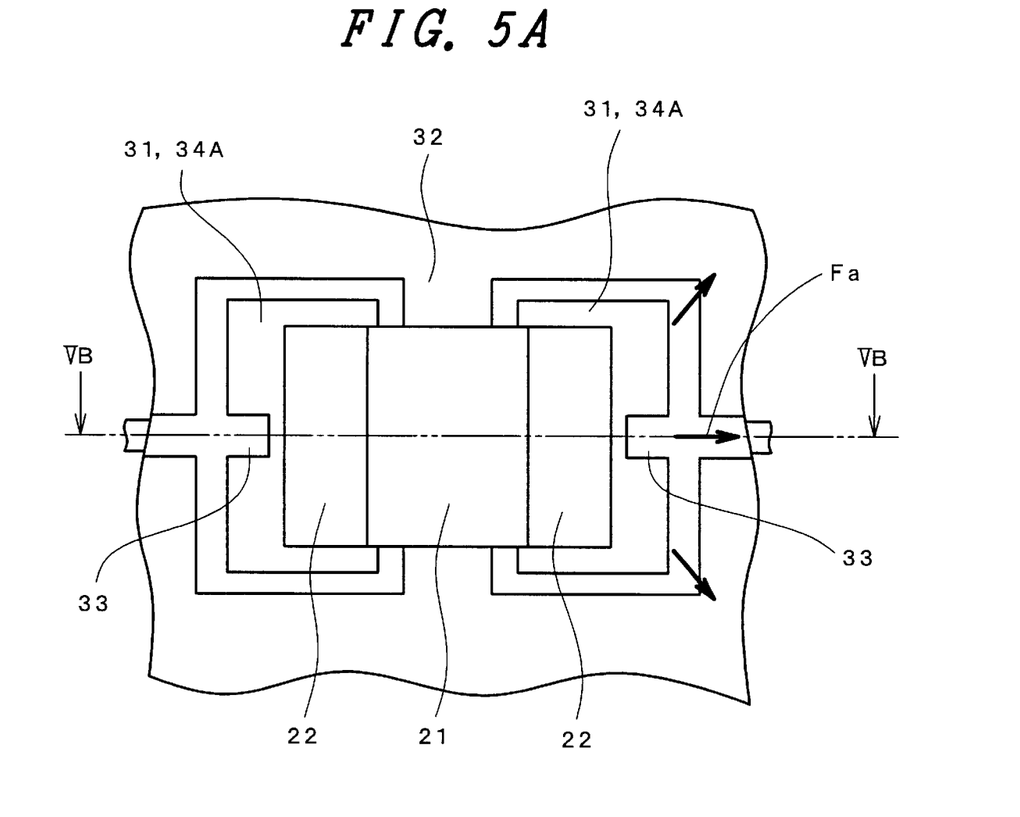
FIG. 5A is a plan view of the present embodiment and FIG. 5B is a cross-sectional view of an essential part of the present embodiment of FIG. 5A taken along line V B-VB of FIG. 5A.
Figure 5B:
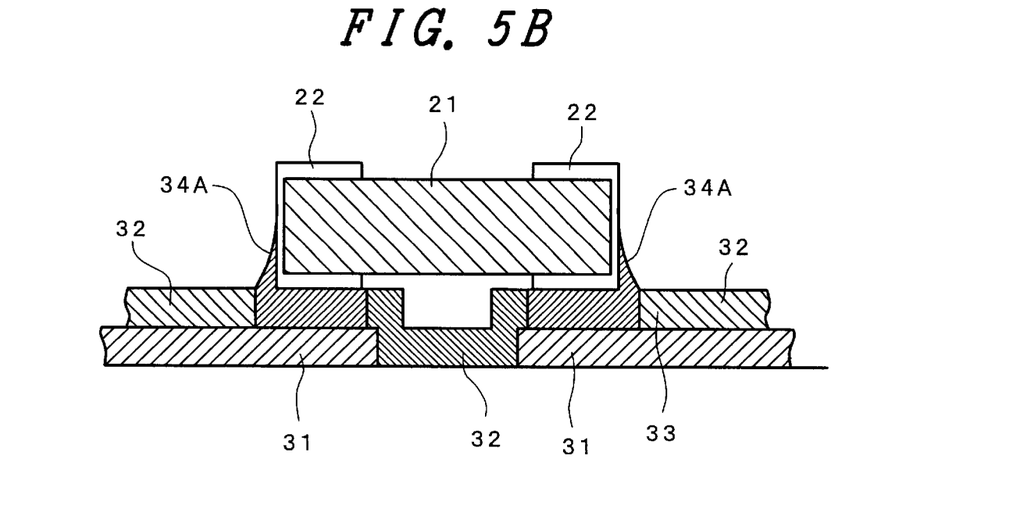

FIGS. 5A and 5B are illustrations for explaining the reason why detrimental standing of a chip component is reduced in the present embodiment, FIG. 5A is a plan view of the present embodiment and FIG. 5B is a cross-sectional view of an essential part of the present embodiment of FIG. 5A taken along line V B-VB of FIG. 5A.

While, with the configuration of the solder resist layer 32 of the prior art driver circuit board 3, the molten solder 34A can contact the entire area of the end faces of the electrodes 22 of the chip component 21 as shown in FIGS. 9A and 9B, the configuration of the solder resist layer 32 of the driver circuit board 3 of the present embodiment shown in FIGS. 5A and 5B makes it more difficult for the solder to remain on the center and its vicinities of the end faces of the electrodes 22 of the chip component 21 compared with the configuration of the solder resist layer 32 of the prior art driver circuit board 3 because the protrusions 33 of the solder resist layer 32 are close to the center and its vicinities of the end faces of the electrodes 22 of the chip component 21.

The central areas of the end faces of the electrodes 22 of the chip component 21 are positions where the angular moment acts efficiently for standing the chip component 21, and therefore intentional limiting of the amount of the solder at the central areas of the end faces of the electrodes 22 makes it difficult for the chip component 21 to stand.

As shown in FIGS. 5A and 5B, in reflowing of solder, this embodiment can make a force Fa pulling the electrodes 22 of the chip component 21 in a direction of arrangement of the two electrodes 22 and produced by a molten solder 34A on one of a pair of land areas 31 where the solder has started to melt earlier than in the other of the pair of land areas 31, smaller than a pulling force Fb in the prior art indicated in FIG. 9A, and consequently, this embodiment can reduce detrimental standing of the chip components 21.

This effect appears distinctly when the flow of the molten solder 34A is controlled by a side wall of the solder resist layer 32 within the opening formed in the solder resist layer 32 lying on the land area 31.

Consequently, it is desirable that the edge of the opening made in the solder resist layer 32 is positioned on the periphery of the land area 31, in other words, the periphery of the land area 31 is covered with the solder resist layer 32.

Structures for attaching chip components similar to this embodiment are disclosed in Japanese Patent Application Laid-open No. Hei 2-23694 (Laid-open on Jan. 25, 1990) and Japanese Patent Application Laid-open No. Hei 3-77394 (Laid-open on Apr. 2, 1991). However, the structures for attaching the chip components described in these references are such that at least a portion of each of solder resist strips for dividing a corresponding one of a pair of land areas into two portions is sandwiched between the corresponding land area and a bottom surface of a corresponding one of two electrodes provided at both ends of the chip component.

In such structures, it is thought that detrimental standing of chip components occurs more easily than in the present embodiment in the following cases (1) to (3).

(1) A case where the solder paste and the land area are designed to have the same shape and the size:

In the above prior art, there is a region in a bottom surface of electrodes of a chip component which does not contact a solder paste, therefore a contact area between the bottom surface of the electrodes and the solder paste for fixing the bottom surface is made smaller, and consequently, adherence between the bottom surfaces of the electrodes and the land areas is reduced, and chip-standing defects occur easily.

(2) A case where the solder pastes are printed in the same shape as the land areas, but in a smaller size than the land areas:

In this case also, in the above prior art, the chip-standing defects occur easily for the reason similar to that in the case (1).

(3) A case where the solder pastes are printed in the same shape as the land areas, but in a larger size than the land areas:

In this case, when a solder paste having been printed on the solder resist film begins to melt, the molten solder is pulled into an exposed portion of copper of the land areas and this increases the amount of the molten solder creeping up the end faces of the electrodes of the chip component. As a result, on one of a pair of land areas where the solder has started to melt earlier than in the other of the pair of land areas, the amount of the solder for fixing the bottom surface of the electrode of the chip component is reduced and at the same time, the amount of the solder pulling the electrode tends to increase. Consequently, the chip component is easily turned about a side of the end face of the electrode on the land area where the solder has started to melt earlier with the side of the end face contacting with the land area and serving as a fulcrum, and therefore chip-standing defects occur easily.

Figure 6:
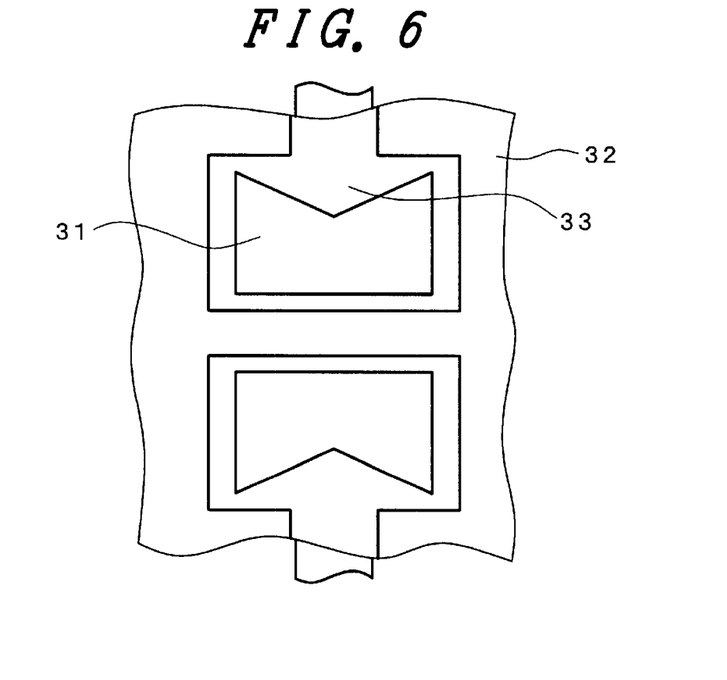
FIG. 6 is a fragmentary plan view of another embodiment in accordance with the present invention.
Figure 7:
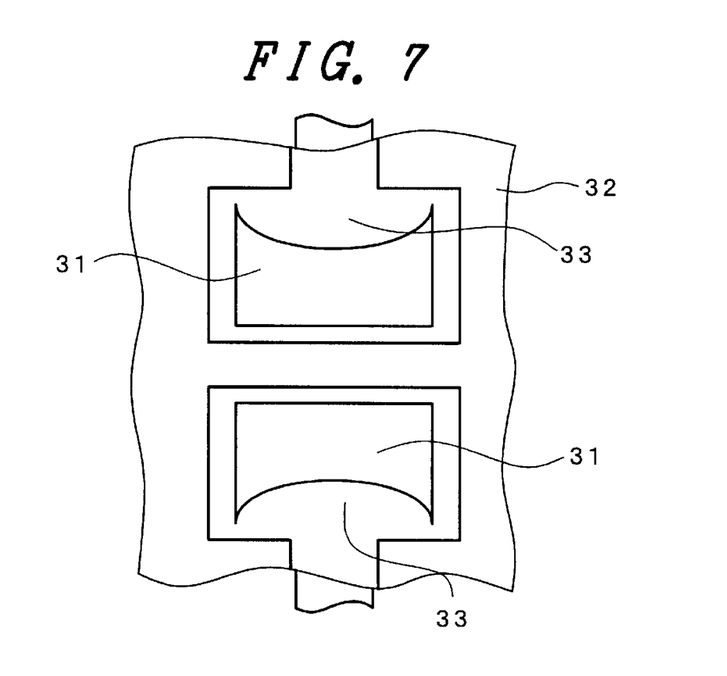
FIG. 7 is a fragmentary plan view of still another embodiment in accordance with the present invention.

In the present invention, the shape of the protrusions 33 of the solder resist film 32 disposed on the land areas 31 is not limited to a rectangle, but the shape of the protrusions can be triangular as shown in FIG. 6, or can be arcuate as shown in FIG. 7, and these protrusions provide the advantages similar to those in the above embodiment.

As explained above, the present embodiment is capable of reducing occurrences of chip-standing defects in the operation of soldering the chip component 21 to the driver circuit board 3. Consequently, the present embodiment is capable of improving productivity and productive capacity of circuit boards 3 constituting the liquid crystal display module and therefore is capable of reducing their manufacturing cost.

The present invention has been explained by using the above embodiments applied to the liquid crystal display modules of the TFT type, but the present invention is not limited to these, and it is needless to say that the present invention is applicable to the liquid crystal display modules of the STN type. The attachment structure of a chip component in accordance with the present invention is also applicable to circuit boards of the backlight unit such as a circuit board for an inverter circuit for driving a cold-cathode fluorescent lamp.

The present invention made by the present inventors has been explained concretely based upon the above embodiments, but the present invention is not limited to the above embodiments and it is needless to say that various changes and modifications can be made to the above embodiments without departing from the nature and spirit of the present invention.

The following explains briefly advantages provided by representative ones of the inventions disclosed in the present specification.

(1) The liquid crystal display device in accordance with the present embodiment is capable of reducing occurrences of defective soldering of a chip component (chip-standing defects) in the operation of soldering a chip component to a circuit board.

(2) The liquid crystal display device in accordance with the present embodiment is capable of improving productivity and productive capacity of circuit boards constituting the liquid crystal display device and therefore is capable of reducing their manufacturing cost.

What is claimed is:

1. A liquid crystal display device comprising
    a liquid crystal display panel including a pair of opposing substrates and a liquid crystal layer sandwiched between said pair of opposing substrates;

at least one driver circuit disposed at a periphery of one of said pair of opposing substrates for applying a drive voltage to said liquid crystal layer; and a circuit board mounting thereon a display control circuit for controlling and driving said at least one driver circuit, wherein said circuit board including at least one chip component having a pair of electrodes disposed at respective ends thereof, said pair of electrodes being soldered to a pair of land areas disposed on said circuit board, respectively, with a distance EL between outer ends of said pair of electrodes, a solder resist layer partially covering over said pair of land areas and having a pair of protrusions each protruding from a central part of an outer edge of a corresponding one of said land areas towards an outer end of a corresponding one of said electrodes while satisfying $L \geq EL$, where L is a distance between said protrusions of said solder resist layer.

2. A liquid crystal display device comprising a liquid crystal display panel including a pair of opposing substrates and a liquid crystal layer sandwiched between said pair of opposing substrates;

at least one driver circuit disposed at a periphery of one of said pair of opposing substrates for applying a drive voltage to said liquid crystal layer; and a circuit board mounting thereon a display control circuit for controlling and driving said at least one driver circuit, wherein said circuit board including a chip component having a pair of electrodes disposed at respective ends thereof, said pair of electrodes being soldered to a pair of land areas disposed on said circuit board, respectively, with a distance EL between outer ends of said pair of electrodes, a solder resist layer partially covering over said pair of land areas and having a pair of protrusions each protruding from a central part of an outer edge of a corresponding one of said land areas towards an outer end of a corresponding one of said electrodes while satisfying $L \geq EL$, where L is a distance between said protrusions of said solder resist layer, and a length h of each of said protrusions of said solder resist layer as measured in a protruding direction thereof satisfying $h \geq EL/10$.

3. A liquid crystal display device according to claim 1, wherein said protrusion of said solder resist is rectangular, and a width w of said protrusion as measured in a direction perpendicular to a protruding direction thereof satisfies an inequality $w \geq EL/10$.

4. A liquid crystal display device according to claim 2, wherein said protrusion of said solder resist is rectangular, and a width w of said protrusion as measured in a direction perpendicular to said protruding direction thereof satisfies an inequality $w \geq EL/10$.

5. A liquid crystal display device according to claim 1, wherein said protrusion of said solder resist is triangular.

6. A liquid crystal display device according to claim 2, wherein said protrusion of said solder resist is triangular.

7. A liquid crystal display device according to claim 1, wherein said protrusion of said solder resist is arcuate.

8. A liquid crystal display device according to claim 2, wherein said protrusion of said solder resist is arcuate.

9. A liquid crystal display device according to claim 1, wherein said pair of electrodes are soldered to said pair of land areas by using a solder having a melting point higher than that of Sn—Pb system solders.

10. A liquid crystal display device according to claim 2, wherein said pair of electrodes are soldered to said pair of land areas by using a solder having a melting point higher than that of Sn—Pb system solders.

11. A liquid crystal display device according to claim 1, wherein said pair of electrodes are soldered to said pair of land areas by using a solder having a melting point equal to or higher than 200° C.

12. A liquid crystal display device according to claim 2, wherein said pair of electrodes are soldered to said pair of land areas by using a solder having a melting point equal to or higher than 200° C.

* * * * *

UNITED STATES PATENT AND TRADEMARK OFFICE
CERTIFICATE OF CORRECTION

PATENT NO.    : 6,657,697 B2
DATED         : December 2, 2003
INVENTOR(S)   : Yamate et al.

It is certified that error appears in the above-identified patent and that said Letters Patent is hereby corrected as shown below:

Title page,
Item [56], References Cited, FOREIGN PATENT DOCUMENTS, please add the following:
-- 2-23694     07/12/88    Japan
   3-77394     08/21/89    Japan
   54-035776   08/25/77    Japan
   4-22780     06/19/90    Japan --

Signed and Sealed this

Thirtieth Day of March, 2004

JON W. DUDAS
*Acting Director of the United States Patent and Trademark Office*